(12) United States Patent
Franke et al.

(10) Patent No.: US 8,796,791 B2
(45) Date of Patent: Aug. 5, 2014

(54) HYBRID INTERGRATED COMPONENT AND METHOD FOR THE MANUFACTURE THEREOF

(71) Applicants: Axel Franke, Ditzingen (DE); Patrick Wellner, Walddorfhaeslach (DE); Lars Tebje, Reutlingen (DE)

(72) Inventors: Axel Franke, Ditzingen (DE); Patrick Wellner, Walddorfhaeslach (DE); Lars Tebje, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/888,920

(22) Filed: May 7, 2013

(65) Prior Publication Data

US 2013/0299927 A1 Nov. 14, 2013

(30) Foreign Application Priority Data

May 14, 2012 (DE) .......................... 10 2012 208 053

(51) Int. Cl.
*G01P 15/08* (2006.01)

(52) U.S. Cl.
USPC ........... 257/417; 257/418; 257/415; 257/253; 257/254

(58) Field of Classification Search
USPC .......................... 257/417, 415, 418, 253, 254
See application file for complete search history.

(56) References Cited

U.S. PATENT DOCUMENTS 7,956,428 B2 * 6/2011 Yama ............................. 257/415
2009/0152654 A1 * 6/2009 Classen et al. ................. 257/415

FOREIGN PATENT DOCUMENTS

EP 0773443 5/1997

* cited by examiner

*Primary Examiner* — Timor Karimy
(74) *Attorney, Agent, or Firm* — Kenyon & Kenyon LLP

(57) ABSTRACT

Measures are proposed by which the design freedom is significantly increased in the case of the implementation of the micromechanical structure of the MEMS element of a component, which includes a carrier for the MEMS element and a cap for the micromechanical structure of the MEMS element, the MEMS element being mounted on the carrier via a stand-off structure. The MEMS element is implemented in a layered structure, and the micromechanical structure of the MEMS element extends over at least two functional layers of this layered structure, which are separated from one another by at least one intermediate layer.

9 Claims, 4 Drawing Sheets

HYBRID INTERGRATED COMPONENT AND METHOD FOR THE MANUFACTURE THEREOF

FIELD OF THE INVENTION

The present invention relates to a component at least including a carrier, in particular in the form of an ASIC (application-specific integrated circuit) element, an MEMS (micro-electromechanical system) element, and a cap. The MEMS element is mounted on the carrier via a standoff structure and the cap is situated above the micromechanical structure of the MEMS element.

Furthermore, the present invention relates to a method for manufacturing such a hybrid integrated component, in the case of which a standoff structure is produced on the carrier, the functional layer of an SOI wafer functioning as the MEMS substrate is structured, and the MEMS substrate is mounted face down, with the structured functional layer on the standoff structure of the carrier.

BACKGROUND INFORMATION

European Published Patent Application No. 0 773 443 describes a micromechanical acceleration sensor that is implemented in the form of a chip stack, including an ASIC substrate and an MEMS substrate. An SOI wafer, in the functional layer of which a rocker-shaped sensor structure is implemented, functions as the MEMS substrate. The MEMS substrate is mounted using flip-chip technology on the ASIC substrate via space holders, so that the sensor structure is located in a hermetically sealed cavity between the ASIC surface and the SOI substrate. Accelerations cause a deflection of the rocker structure, which is detected capacitively here with the aid of measuring electrodes on the sensor structure and stationary electrodes on the ASIC surface. In the case of the known acceleration sensor, the evaluation circuit for the measuring signals is additionally integrated on the ASIC substrate.

SUMMARY

Measures are proposed by the present invention, by which the design freedom is substantially increased in the case of the implementation of the micromechanical structure of the MEMS element within the scope of the known component concept.

This is achieved according to the present invention in that the micromechanical structure of the MEMS element extends over at least two functional layers of the layered structure of the MEMS element, these two functional layers being separated from one another by at least one intermediate layer, so that they may easily be structured independently of one another. Since in this way the third dimension may also be incorporated in the layout of the micromechanical structure of the MEMS element, not only is the design freedom increased in the implementation of the micromechanical structure, but the chip area of the MEMS element and therefore also of the component as a whole may be used more efficiently, which is associated with a reduction of the manufacturing costs.

In one preferred specific embodiment of the present invention, the two functional layers are made of monocrystalline silicon. In this case, only very low mechanical tensions occur within the layers—if at all—which has an advantageous effect on the micromechanical performance of the component.

According to a first manufacturing variant according to the present invention, a single SOI wafer is therefore used as the MEMS substrate. In this case, the SOI substrate functions as the second functional layer of the MEMS substrate. The SOI substrate is then structured as the second functional layer after mounting the MEMS substrate or the ASIC substrate on the carrier, so that a micromechanical structure results, which extends over the functional layer and the SOI substrate of the SOI wafer. A cap wafer is only then mounted above the micromechanical structure of the MEMS substrate. Since the carrier substrate of an SOI wafer is generally significantly thicker than the intended structural height of the micromechanical structure to be produced, the SOI substrate is usually also thinned back to a defined thickness after the mounting on the carrier and before the structuring.

In the case of a second manufacturing variant according to the present invention, a two-layer SOI wafer is used as the starting substrate for the MEMS element. Such an SOI wafer includes two monocrystalline functional layers, which are separated from one another and from the SOI substrate by insulating layers. The uppermost functional layer is structured even before mounting this SOI wafer on the carrier. The second functional layer of the SOI wafer functions as the second functional layer of the MEMS substrate and is structured only after mounting the MEMS substrate on the carrier, specifically after the SOI substrate has been removed. In this way, a micromechanical structure results, which extends over the two functional layers of the SOI wafer. Only then is a cap wafer mounted above the micromechanical structure of the MEMS element.

This second manufacturing variant is preferable in particular if a structural height which is predefined for the micromechanical structure is to be observed very precisely. This is because the thicknesses of the two functional layers of a two-layer SOI wafer may be set very precisely, while substantially higher thickness tolerances occur in the case of a thinning back process, as is carried out within the scope of the first manufacturing variant.

In the case of both manufacturing variants, the two functional layers of the MEMS substrate are structured independently of one another. The layouts of the two functional layers complement one another and together determine the three-dimensional shape of the micromechanical structure of the MEMS substrate. This micromechanical structure may, but does not have to be, designed symmetrically with the intermediate layer between the two functional layers. An asymmetry may be attributed, for example, to different layer thicknesses of the two functional layers. In addition, the layouts of the two functional layers may differ, so that at least one section of the micromechanical structure extends over both functional layers, while at least one other section only extends over one of the two functional layers. Manifold design variations for the micromechanical structure of the MEMS element result due to this third layout dimension.

The refined component concept according to the present invention is suited in particular for the implementation of inertial sensor components. In the case of this application, the micromechanical structure of the MEMS element includes at least one deflectable seismic mass and is equipped with a circuit for detecting the deflections of the seismic mass. The seismic mass is situated in a cavity between the cap and an ASIC element having an evaluation circuit for the sensor signals. The cavity is advantageously hermetically closed, so that the micromechanical sensor structure is protected from soiling and the influences of an aggressive measuring environment. In addition, defined pressure conditions may be produced within this cavity, in order to thus positively influence the damping behavior of the sensor. Since the micromechanical structure of the MEMS element extends over two functional layers according to the present invention, large seismic masses may be implemented on a comparatively small chip area. This contributes to a high measuring sensitivity at a small component size. In the case of some inertial sensor types, for example, in the case of sensor components for detecting accelerations perpendicular to the layer planes of the component structure, the mass distribution of the seismic mass is asymmetrical to its suspension or mounting. Due to the three-dimensional layout possibilities according to the present invention of the micromechanical structure, such a sensor design may also be implemented particularly simply on a very small chip area, in that the seismic mass includes at least one section which extends over both functional layers, and at least one section which only extends over one of the two functional layers. To increase the measuring sensitivity of the sensor structure, ventilation openings may additionally also be implemented in the seismic mass, which extend over the entire thickness of the seismic mass, i.e., over both functional layers and the intermediate layer or also over only one of the two functional layers, depending on which layers the seismic mass is implemented on.

DETAILED DESCRIPTION

Figure 1:
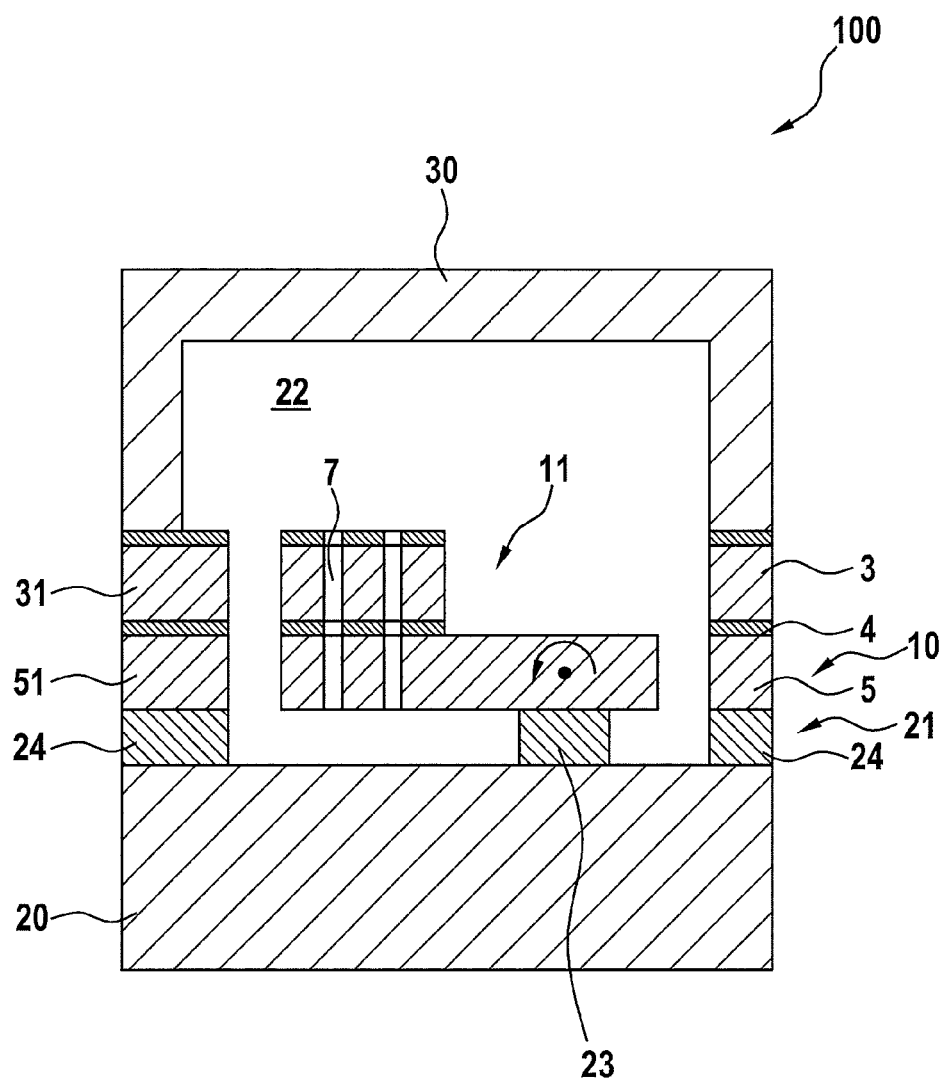
FIG. 1 shows a schematic sectional view through the structure according to the present invention of an inertial sensor component.

Component 100 shown in FIG. 1 is an inertial sensor for detecting z-accelerations, i.e., accelerations which are oriented perpendicularly to the layer planes of the component structure. For this purpose, component 100 includes an MEMS element 10 having a micromechanical sensor structure, in which a seismic mass 11 is implemented in the rocker design. This will be explained in greater detail hereafter. MEMS element 10 is additionally equipped with an arrangement for detecting the deflection of this seismic mass 11, which are, however, not shown in detail here. Furthermore, component 100 includes an ASIC element 20, having an evaluation circuit for the sensor signals of MEMS element 10, and a cap 30.

Component 100 is implemented in the form of a wafer stack. ASIC element 20 functions as the carrier of component 100. MEMS element 10 is mounted via a standoff structure 21 on ASIC element 20, so that the mobility of sensor structure 11 is ensured. Cap 30 is arranged above sensor structure 11 of MEMS element 10 and mounted on MEMS element 10 in such a way that sensor structure 11 is situated within a closed cavity 22 between ASIC element 20 and cap 30.

According to the present invention, MEMS element 10 is implemented in a layered structure, the micromechanical sensor structure and in particular seismic mass 11 extending over two functional layers 3, 5 of this layered structure. These two functional layers 3, 5 are separated from one another by an insulating intermediate layer 4, so that the two functional layers 3, 5 are electrically separated.

Seismic mass 11 is mounted here in one point like a rocker. For this purpose, it is connected via a single support point 23 of standoff structure 21 to ASIC element 20. Since the mass distribution of seismic mass 11 is asymmetrical in relation to this mount, accelerations perpendicular to the layer planes of the component structure cause a rotational movement of seismic mass 11 around its mount, which is indicated in FIG. 1 by an arrow. The asymmetrical mass distribution of seismic mass 11 in relation to its mount is not only to be attributed to the off-center arrangement of support point 23, but rather also to the fact that seismic mass 11 is implemented on one side of support point 23 in both functional layers 3, 5, while on the other side of support point 23, it only extends over one functional layer 5, since other functional layer 3 has been removed from this area. Accordingly, seismic mass 11 is approximately twice as thick on one side as on the other side.

In the exemplary embodiment shown here, ventilation openings 7, which extend over the entire thickness of seismic mass 11, i.e., over both functional layers 3 and 5 and intermediate layer 4, are implemented on the one side of seismic mass 11. These ventilation openings 7 contribute to reducing the damping of sensor structure 11.

One preferred method variant for manufacturing above-described inertial sensor component 100 will be explained hereafter on the basis of FIGS. 2a through 2d. This method is directed to three substrates, which are initially processed independently of one another.

Figure 2A:
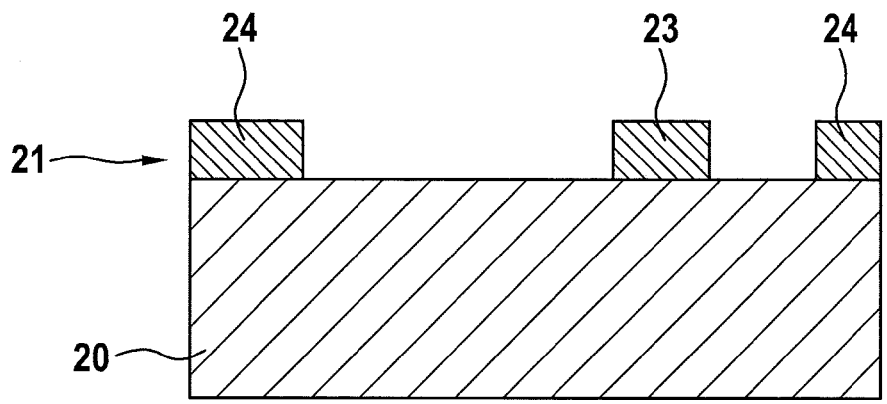
FIG. 2a is a first schematic sectional view of the manufacturing of the inertial sensor component through the individual parts of the component structure.

As already mentioned, in the exemplary embodiment described here, an ASIC element 20 functions as the carrier of the component structure. Since such ASIC elements are generally not manufactured individually but rather in a large number in the wafer composite, the teen "ASIC substrate 20" is used hereafter as a synonym for the term "ASIC element 20". FIG. 2a shows an ASIC substrate 20, which has been provided with a signal processing and evaluation circuit for the MEMS sensor function of component 100, which is not shown in detail here. In addition, ASIC substrate 20 may, however, also include MEMS-independent circuit functions. The CMOS processing of ASIC substrate 20 will not be described in detail here, since it is not specified in greater detail by the present invention. A silicon oxide layer 21 was deposited and structured on ASIC substrate 20 shown here. This structured silicon oxide layer 21 is used, on the one hand, as the electrical insulation for ASIC substrate 20 in relation to the further parts of the component structure and, on the other hand, forms a standoff structure for the mounting of an MEMS substrate. Standoff structure 21 includes a support point 23 for the seismic mass of the sensor structure and a peripheral bond frame 24 for the MEMS substrate.

Since MEMS element 10 is also manufactured in the wafer composite within the scope of the manufacturing of component 100, the terms "MEMS element" and "MEMS substrate" are also used as synonyms hereafter. In the manufacturing variant described here, a two-layer SOI wafer is used as MEMS substrate 10, which includes an SOI substrate 1, a lower oxide layer 2, a lower silicon functional layer 3, a further oxide layer 4, and an upper silicon functional layer 5. Such an SOI wafer may be manufactured, for example, by a repeated sequence of thermal oxidation, silicon direct bonding, trenching steps (DRIE), and polishing steps (CMP).

Figure 2B:
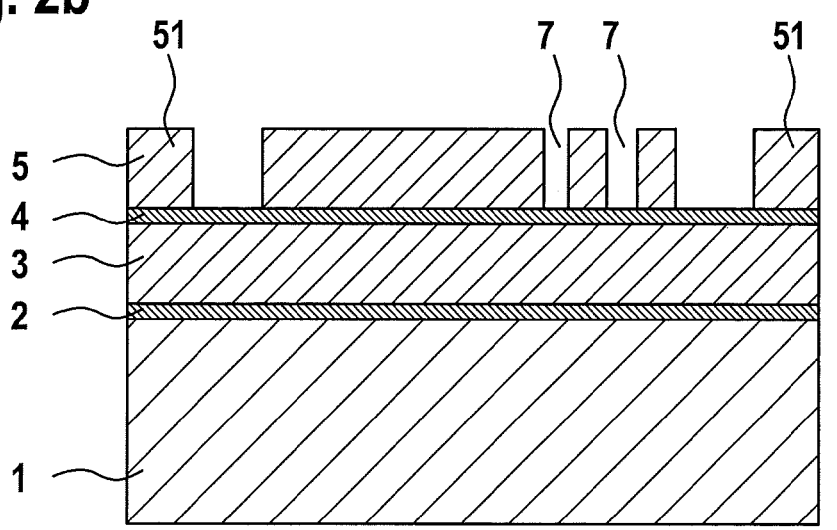
FIG. 2b is a second schematic sectional view of the manufacturing of the inertial sensor component through the individual parts of the component structure.
Figure 2C:
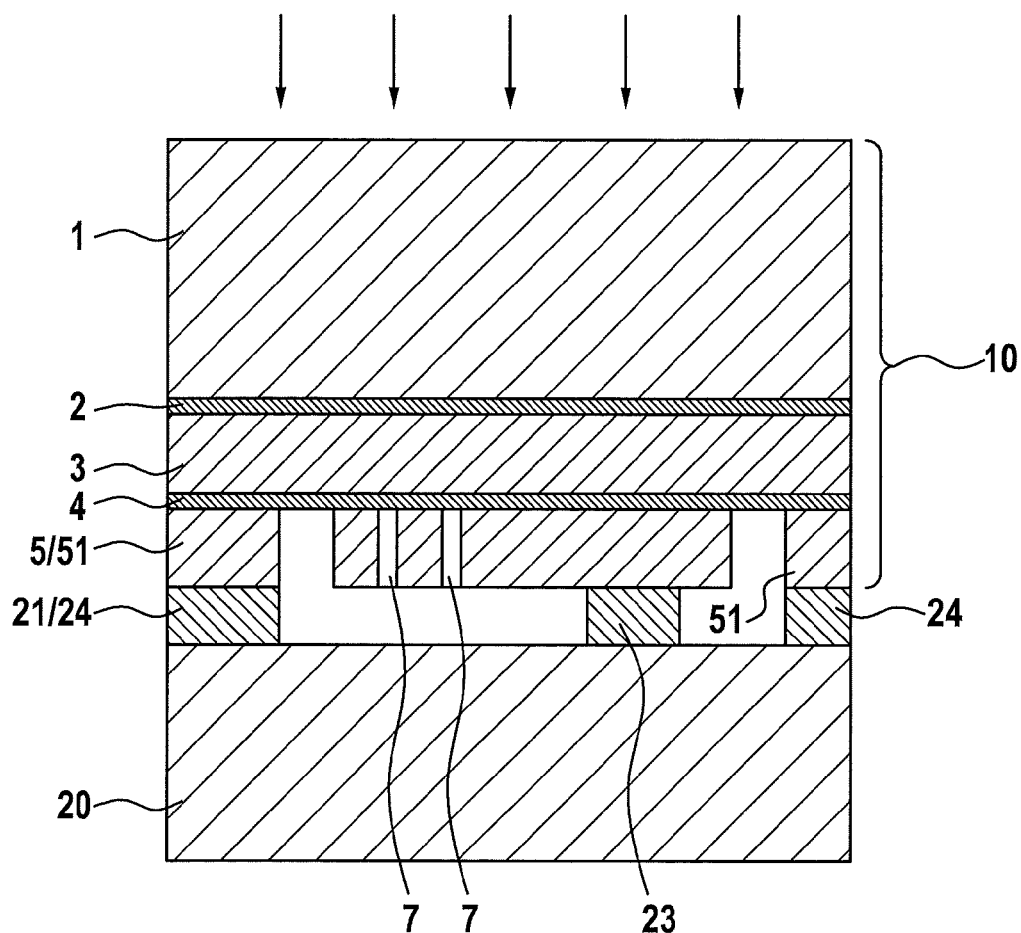
FIG. 2c is a third schematic sectional view of the manufacturing of the inertial sensor component through the individual parts of the component structure.

FIG. 2b shows MEMS substrate 10 after the pre-processing, during which upper silicon functional layer 5 was structured, in order to expose a bond frame 51 for the mounting on ASIC substrate 20 or bond frame 24 of standoff structure 21 and the lower part of the micromechanical sensor structure having ventilation openings 7 in seismic mass 11. Structuring processes may be used for this purpose, as are typical in microsystem technology, for example, lithography in combination with trenching processes. Upper oxide layer 4 may advantageously be used as the etch stop in this case. MEMS substrate 10 is then mounted face down, i.e., with structured upper functional layer 5, on standoff structure 21 of ASIC substrate 20, as shown in FIG. 2c.

The connection between MEMS substrate 10 and ASIC substrate 20 is preferably established in a bonding process, for example, by low-temperature silicon direct bonding. On the one hand, such connections are very stable and therefore permanent. On the other hand, micromechanical sensor structure 11 may thus easily be closed in a hermetically sealed manner in resulting cavity 22 between ASIC substrate 20 and cap 30. The arrows on the rear side of MEMS substrate 10 illustrate that SOI substrate 1 is removed after the mounting, for example, by trenching or KOH etching. Oxide layer 2 may either also be removed, or it may be used as a hard mask for the following structuring step of lower functional layer 3.

Figure 2D:
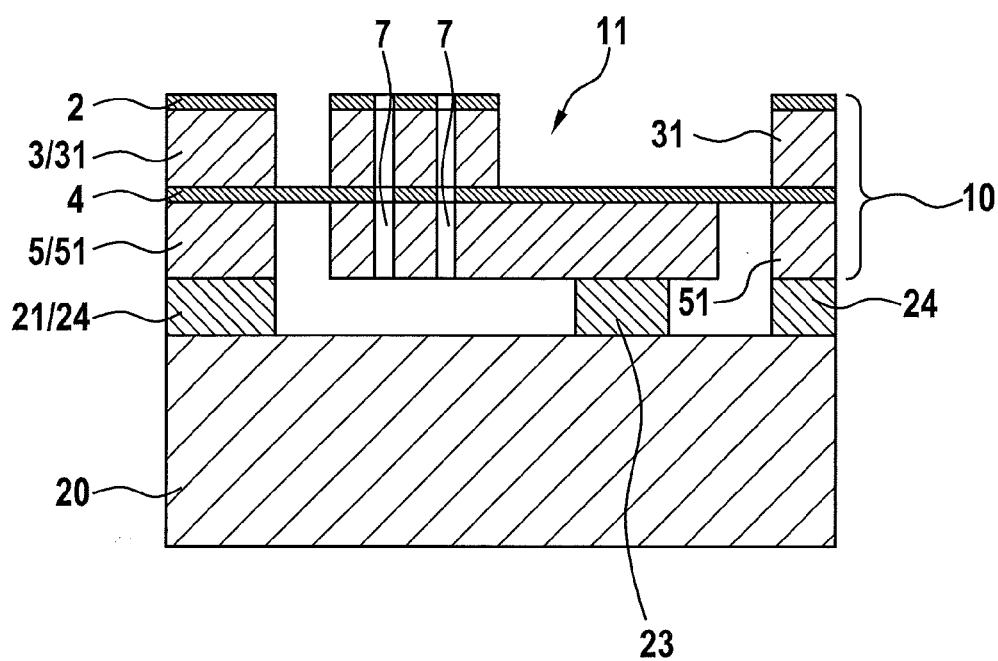
FIG. 2d is a fourth schematic sectional view of the manufacturing of the inertial sensor component through the individual parts of the component structure.

This structuring is carried out independently of the structuring of upper functional layer 5, since the two functional layers 3 and 5 are separated from one another by oxide layer 4, which functions as the etch stop. Accordingly, the layout of lower functional layer 3 may also be selected independently of the layout of upper functional layer 5, which is illustrated by FIG. 2d. In contrast to functional layer 5, functional layer 3 was completely removed from the area above support point 23 and to the right of support point 23. Accordingly, the mass distribution of seismic mass 11, which is composed of the two functional layers 3 and 5, is clearly asymmetrical to support point 23. Furthermore, a bond frame 31 for the mounting of a cap wafer was structured out of functional layer 3. FIG. 2d shows the component structure after oxide layer 4 was selectively opened, in order to electrically connect the two functional layers 3 and 5 by depositing a conductive layer, for example, aluminum or polysilicon. However, this layer is not shown here.

Subsequently, the sensor structure and in particular seismic mass 11 is finally exposed. For this purpose, the exposed areas of oxide layers 2 and 4 are removed, for example, by HF gas phase etching. This etching process should be sufficiently short or should be subject to timed monitoring, so as not to destroy standoff structure 21.

A cap wafer which is pre-structured in a suitable way is then installed as the third substrate on MEMS substrate 10 thus processed. The connection between MEMS substrate 10 and the cap wafer may be established, for example, by eutectic bonding or also with the aid of glass solder. Only then are the individual components detached from the wafer composite. The separation takes place by sawing, for example. The result of the above-described manufacturing method is a component 100 as shown in FIG. 1.

Finally, it is also to be noted that the component concept according to the present invention is not restricted to sensor applications, but rather may also be used in the implementation of actuator components.

What is claimed is:

1. A component, comprising:
   a carrier;
   a standoff structure;
   an MEMS element including a micromechanical structure and mounted on the carrier via the standoff structure; and
   a cap situated above the micromechanical structure of the MEMS element, wherein:
      the MEMS element is implemented in a layered structure including a plurality of functional layers, and
      the micromechanical structure of the MEMS element extends over at least two functional layers of the layered structure that are separated from one another by at least one intermediate layer.

2. The component as recited in claim 1, wherein the micromechanical structure of the MEMS element includes at least one section that extends over the at least two functional layers and at least one section that only extends over one of the at least two functional layers.

3. The component as recited in claim 1, wherein the at least two functional layers of the MEMS element are monocrystalline silicon layers.

4. The component as recited in claim 1, wherein one functional layer of the MEMS element is formed by a functional layer of an SOI wafer, and an other functional layer of the MEMS element is formed by an SOI carrier substrate.

5. The component as recited in claim 1, wherein the at least two functional layers of the MEMS element are formed by two functional layers of a two-layer SOI wafer.

6. The component as recited in claim 1, wherein:
   the carrier includes an ASIC element provided with an evaluation circuit for a sensor signal,
   the micromechanical structure of the MEMS element includes at least one deflectable seismic mass,
   the micromechanical structure is equipped with a circuit for detecting a deflection of the seismic mass, and
   the micromechanical structure is situated in a closed cavity between the cap and the ASIC element.

7. The component as recited in claim 6, wherein:
   the seismic mass includes at least one section that extends over the at least two functional layers and at least one section which only extends over one of the at least two functional layers, so that a mass distribution of the seismic mass is asymmetrical to one of a suspension and a mounting of the seismic mass.

8. The component as recited in claim 6, wherein ventilation openings, which extend over an entire thickness of the seismic mass, are implemented in the seismic mass.

9. The component as recited in claim 1, wherein the carrier includes an ASIC element.

* * * * *